US008139364B2

(12) United States Patent
Wickett (10) Patent No.: US 8,139,364 B2
(45) Date of Patent: Mar. 20, 2012

(54) ELECTRONIC CONTROL MODULE ASSEMBLY (75) Inventor: Paul Wickett, Northville, MI (US)

(73) Assignee: Robert Bosch GmbH, Stuttgart (DE)

( * ) Notice: Subject to any disclaimer, the term of this patent is extended or adjusted under 35 U.S.C. 154(b) by 1138 days.

(21) Appl. No.: 11/669,445

(22) Filed: Jan. 31, 2007

(65) Prior Publication Data
US 2008/0180916 A1   Jul. 31, 2008

(51) Int. Cl.
H05K 5/00   (2006.01)
(52) U.S. Cl. .......... 361/752; 361/753; 361/756; 174/50; 174/561; 349/58; 349/150
(58) Field of Classification Search ............ 361/752, 361/753, 756; 174/50, 561; 349/58, 150, 349/607, 609, 717
See application file for complete search history.

(56) References Cited

U.S. PATENT DOCUMENTS

| 2,787,410 | A | * | 4/1957 | Moore ................ 229/125.13 |
| 3,256,975 | A | * | 6/1966 | Puente ..................... 206/706 |
| 4,964,455 | A | | 10/1990 | Meyer |
| 5,153,380 | A | * | 10/1992 | Chang ..................... 174/561 |
| 5,161,689 | A | | 11/1992 | Balson |
| 5,174,464 | A | | 12/1992 | Watt |
| 5,179,501 | A | | 1/1993 | Ocken et al. |
| 5,255,814 | A | | 10/1993 | Delagera |
| 5,261,551 | A | | 11/1993 | Watt |
| 5,521,793 | A | * | 5/1996 | Dalgleish et al. ............ 361/752 |
| 5,568,665 | A | | 10/1996 | Fick |
| 5,711,366 | A | | 1/1998 | Mihelich et al. |
| 5,766,026 | A | | 6/1998 | Cooper et al. |
| 5,819,839 | A | | 10/1998 | Mihelich et al. |
| 5,836,372 | A | | 11/1998 | Kono |
| 5,878,804 | A | | 3/1999 | Williams et al. |
| 5,903,444 | A | | 5/1999 | Sekido et al. |
| 5,983,978 | A | | 11/1999 | Vining et al. |
| 5,996,679 | A | | 12/1999 | Pinnow et al. |
| 6,059,012 | A | | 5/2000 | Vining et al. |
| 6,095,832 | A | * | 8/2000 | Kusuhara et al. ............ 439/135 |
| 6,166,788 | A | * | 12/2000 | Ha et al. ...................... 349/58 |
| 6,178,094 | B1 | | 1/2001 | Hakozaki |
| 6,206,730 | B1 | * | 3/2001 | Avery et al. ................. 439/609 |

(Continued)

FOREIGN PATENT DOCUMENTS
DE   10217780 A1   10/2003
(Continued)

OTHER PUBLICATIONS

European Search Report and Written Opinion for corresponding European Application No. 080000252.0.

*Primary Examiner* — Xiaoliang Chen
(74) *Attorney, Agent, or Firm* — Michael Best & Friedrich LLP (57) ABSTRACT An electronic control module includes a body portion, a printed circuit board positioned within the body portion, and a cap portion adapted to mate with the body portion. One of the body portion and the cap portion is formed with a groove and the other of the body portion and the cap portion is formed with a projection that is resiliently deformable upon entry into the groove to mechanically and sealingly couple the body portion and the cap portion. In some constructions, the projection is a U-shaped flange. In some constructions, the body portion and the cap portion are formed by molding a metal alloy from a thixotropic state.

17 Claims, 5 Drawing Sheets

U.S. PATENT DOCUMENTS

| | | |
|---|---|---|
| 6,434,013 B2 | 8/2002 | Kitamura et al. |
| 6,456,497 B1 * | 9/2002 | Palmer ..................... 361/752 |
| 6,540,543 B1 | 4/2003 | Watanabe |
| 6,549,426 B1 | 4/2003 | Lawlyes et al. |
| 6,570,089 B1 | 5/2003 | McGrew et al. |
| 6,633,492 B2 | 10/2003 | Kimura et al. |
| 6,707,678 B2 | 3/2004 | Kobayashi et al. |
| 6,736,188 B2 | 5/2004 | Vining et al. |
| 6,742,395 B1 * | 6/2004 | Borgers et al. ............... 73/717 |
| 6,881,077 B2 | 4/2005 | Throum |
| 6,926,540 B1 | 8/2005 | Juntwait |
| 7,028,746 B2 | 4/2006 | Akers et al. |
| 7,094,075 B1 | 8/2006 | Lim et al. |
| 7,120,030 B2 | 10/2006 | Azumi et al. |
| 2002/0039528 A1 * | 4/2002 | Kato et al. ............... 415/182.1 |
| 2002/0058445 A1 * | 5/2002 | Tamura et al. ............... 439/717 |
| 2002/0112870 A1 | 8/2002 | Kobayashi et al. |
| 2003/0161110 A1 | 8/2003 | Spasevski et al. |
| 2004/0084171 A1 | 5/2004 | Akers et al. |
| 2004/0095732 A1 | 5/2004 | Azumi et al. |
| 2004/0244875 A1 * | 12/2004 | Yasuda et al. ............... 148/247 |
| 2005/0105253 A1 | 5/2005 | Sakai |
| 2005/0195581 A1 * | 9/2005 | Chiou et al. ............... 361/752 |
| 2006/0023431 A1 | 2/2006 | Wetzel |

FOREIGN PATENT DOCUMENTS

| | | |
|---|---|---|
| WO | 9941531 A1 | 8/1999 |
| WO | 2005025940 A1 | 3/2005 |

* cited by examiner

ELECTRONIC CONTROL MODULE ASSEMBLY

BACKGROUND

The invention relates to electronic control modules, especially for vehicles, which include an electronic component inside a housing. More specifically, the invention relates to a housing for an electronic control module and a method of constructing an electronic control module with the housing.

SUMMARY

In one construction, the invention provides an electronic control module including a body portion, a printed circuit board positioned within the body portion, and a cap portion adapted to mate with the body portion. One of the body portion and the cap portion is formed with a groove and the other of the body portion and the cap portion is formed with a projection that is resiliently deformable upon entry into the groove to mechanically and sealingly couple the body portion and the cap portion.

In another construction, the invention provides a housing of an electronic control module, the housing including a first portion defining a cavity for an electronic component of the electronic control module, the first portion being thixomolded metal alloy and including a first connection portion, and a second portion being thixomolded metal alloy and including a second connection portion, the first portion and second portion being joined at the respective connection portions, substantially enclosing the electronic component, wherein the first connection portion includes one of an endless groove and an endless U-shaped flange formed integrally as part of the first portion, and the second connection portion includes the other of an endless groove and an endless U-shaped flange formed integrally as part of the second portion.

In yet another construction, the invention provides a method of constructing an electronic control module, the method comprising forming a first portion to include a cavity, the first portion being formed with one of a groove and a U-shaped flange, forming a second portion, the second portion being adapted to substantially close the cavity of the first portion and being formed with the other of a groove and a U-shaped flange, inserting an electrical component into the cavity, and mating the first portion and the second portion together by inserting the U-shaped flange into the groove.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

DETAILED DESCRIPTION

Figure 1:
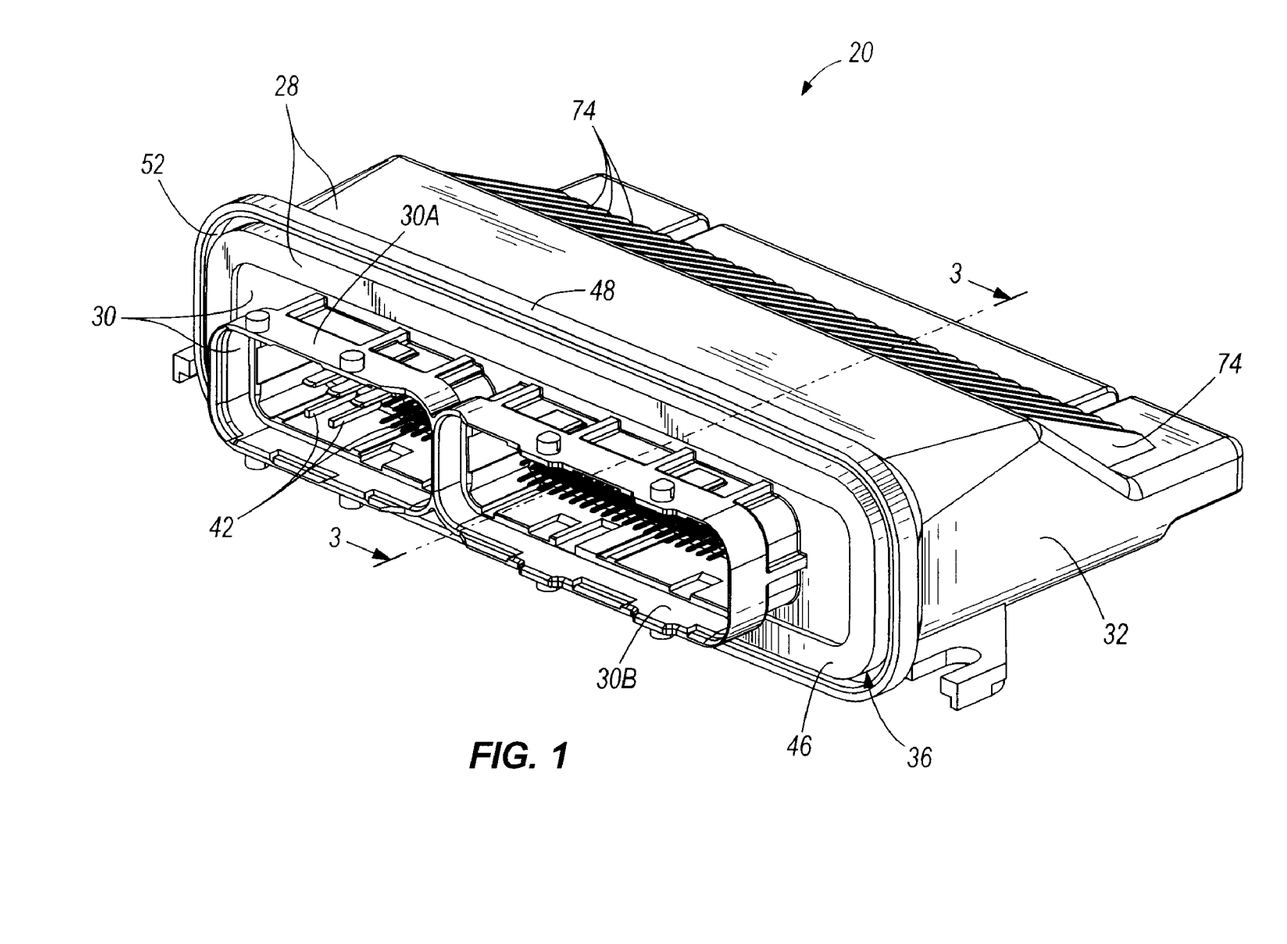
FIG. 1 is a perspective view of an electronic control module embodying the invention.

FIG. 1 illustrates an electronic control module (ECM) 20. The ECM 20 includes an electrical component, such as a printed circuit board (PCB) 24. The PCB 24 is electrically coupled with various sensors and controls of a vehicle (not shown). The vehicle is an off-road vehicle in some constructions, but the ECM 20 may be used in an automobile such as, a car or truck for on-road use in other constructions. Off-road vehicles may include not only dirt bikes, four-wheelers, etc., but also aircraft and watercraft including motorized boats and personal watercraft. The ECM 20 is in electrical communication with an engine of the vehicle to control certain operational characteristics of the engine, which may include but are not limited to air/fuel ratio, throttle response, ignition timing, etc. The ECM 20 also monitors operational characteristics of the engine and/or vehicle by receiving signals from various sensors (e.g., oxygen sensor, throttle position sensor, temperature sensor). The ECM 20 may interpret one or more of the signals in order to control one or more operational aspects of the engine and/or vehicle.

Figure 6:
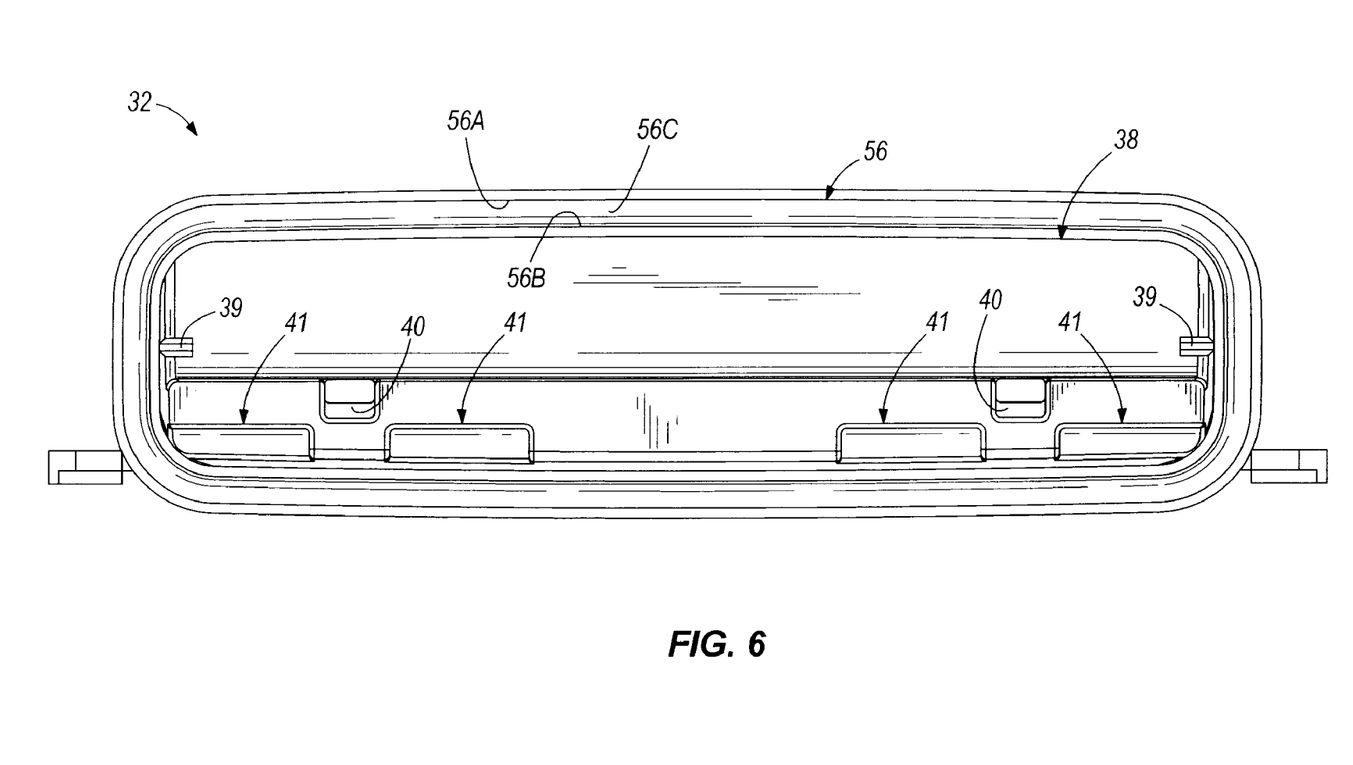
FIG. 6 is a front view of a body portion of the electronic control module of FIG. 1.

In addition to the electrical component (e.g., the PCB 24), the ECM 20 includes a housing assembly 28 and an interface portion 30 (i.e., PCB header). The housing assembly 28 includes a body portion 32 and a cover or cap portion 36. The interface portion 30 can be considered a part of the housing assembly 28 and/or a part of the PCB 24. The body portion 32 defies a cavity 38, which receives the PCB 24. As best shown in FIG. 6, the body portion 32 includes first datum features 39 and second datum features 40, 41. The first datum features 39 provide a "hard stop" or abutment surface, which contacts the interface portion 30 when positioned fully into the cavity 38. The second datum features 40, 41, are discontinuous wall sections in the illustrated construction that fix the position of the PCB 24 within the cavity 38. The second datum features 40, 41 pinch the PCB 24 and minimize fretting.

When the ECM 20 is assembled, the PCB 24 (already attached with the interface portion 30) is inserted into the cavity 38 until it contacts the second datum features 40, 41 and the interface portion 30 contacts the first datum features 39. With the PCB 24 properly in place, the cap portion 36 is coupled to the body portion 32. Although shown separately in the figures and described as such, the interface portion 30 and the cap portion 36 may be partially or fully integrated with each other in some constructions. For example, the cap portion 36 may incorporate some of the features of the interface portion 30, or vice versa. In a fully integrated construction, the cap portion 36 and the interface portion 30 are not separate components, but are provided as a single piece.

The body portion 32 and the cap portion 36 are engageable with each other to substantially enclose the PCB 24. Conductive pins 42, which are electrically and mechanically coupled to the PCB 24, have outer tips 42A that protrude out through the interface portion 30. One or more connectors (not shown), which can be coupled to the interface portion 30, establish electrical communication between the PCB 24 and the various sensors and controls of the vehicle through the pins 42. The pins 42 pass through individual openings 43 in the interface portion 30. The interface portion 30 is secured to the PCB 24 and is mechanically retained by the cap portion 36. In the illustrated construction, the pins 42 are arranged in two separate groups as they pass through the interface portion 30, which is provided with two separate bosses 30A and 30B for establishing mechanical connections with two external connectors.

The interface portion 30 is formed with an O-ring groove 44 around a periphery thereof, the groove 44 opening radially outwardly. An O-ring 45 fits substantially within the O-ring groove 44 and is configured to contact an inner surface of the body portion 32 to make a seal between the interface portion 30 and the body portion 32 when the PCB 24 is inserted into the cavity 38. The O-ring 45 inhibits dust, dirt, water, debris, etc. from entering the cavity 38 between the body portion 32 and the interface portion 30. The cap portion 36 includes a peripheral retaining portion 46 that retains the interface portion 30 (and thus, the PCB 24) in position when the cap portion 36 is engaged with the body portion 32 to close the housing assembly 28.

The openings 43 provide a substantially close-fitting and sealed arrangement around the pins 42 so that the outer tips 42A of the pins 42 are accessible from outside the closed housing assembly 28. The connection between the body portion 32 and the cap portion 36 is also substantially sealed and leak-free (e.g., to prevent entrance of debris and/or seepage of moisture from the surrounding atmosphere into the cavity 38).

Figure 2:
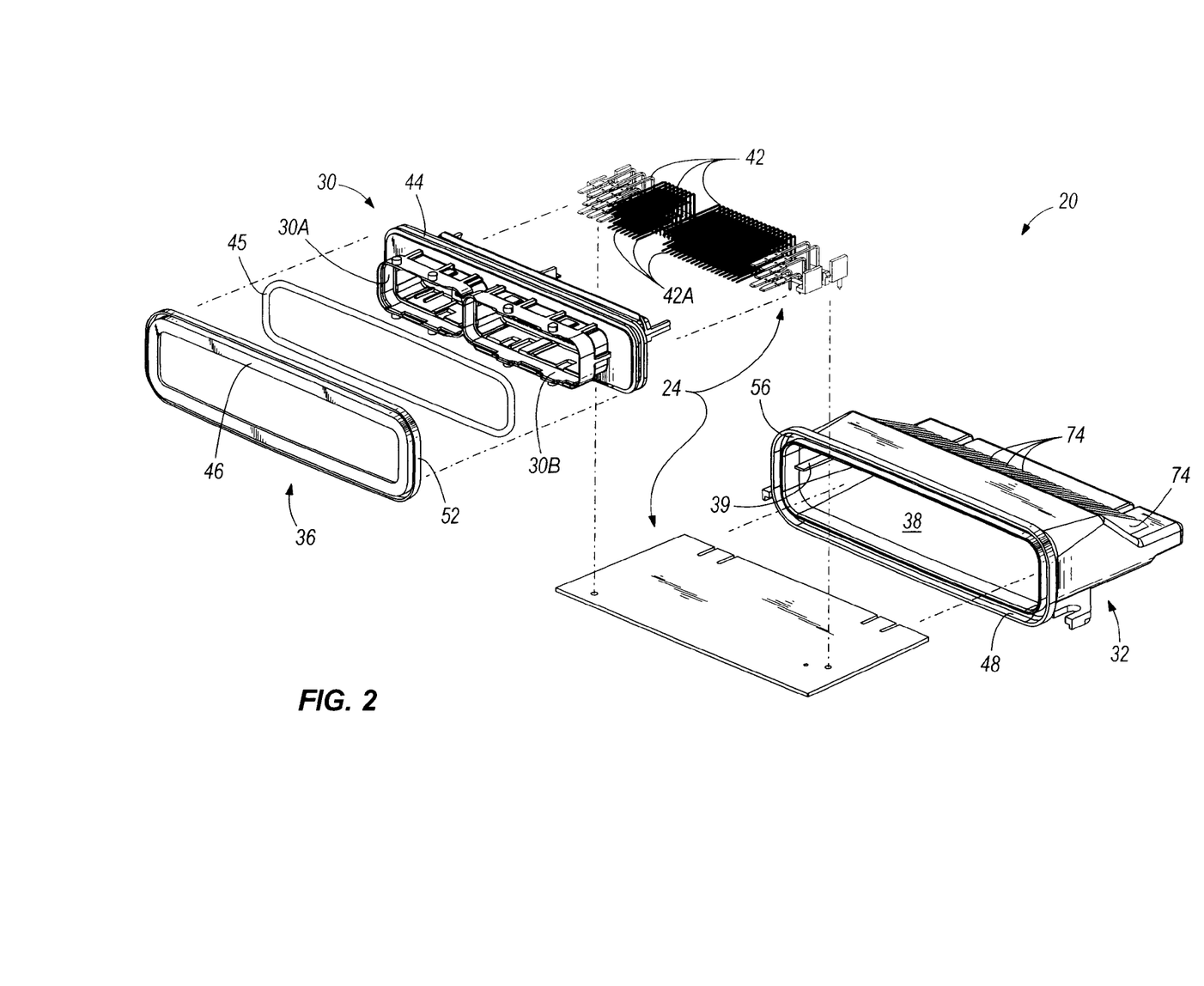
FIG. 2 is an exploded assembly view of the electronic control module of FIG. 1.
Figure 3:
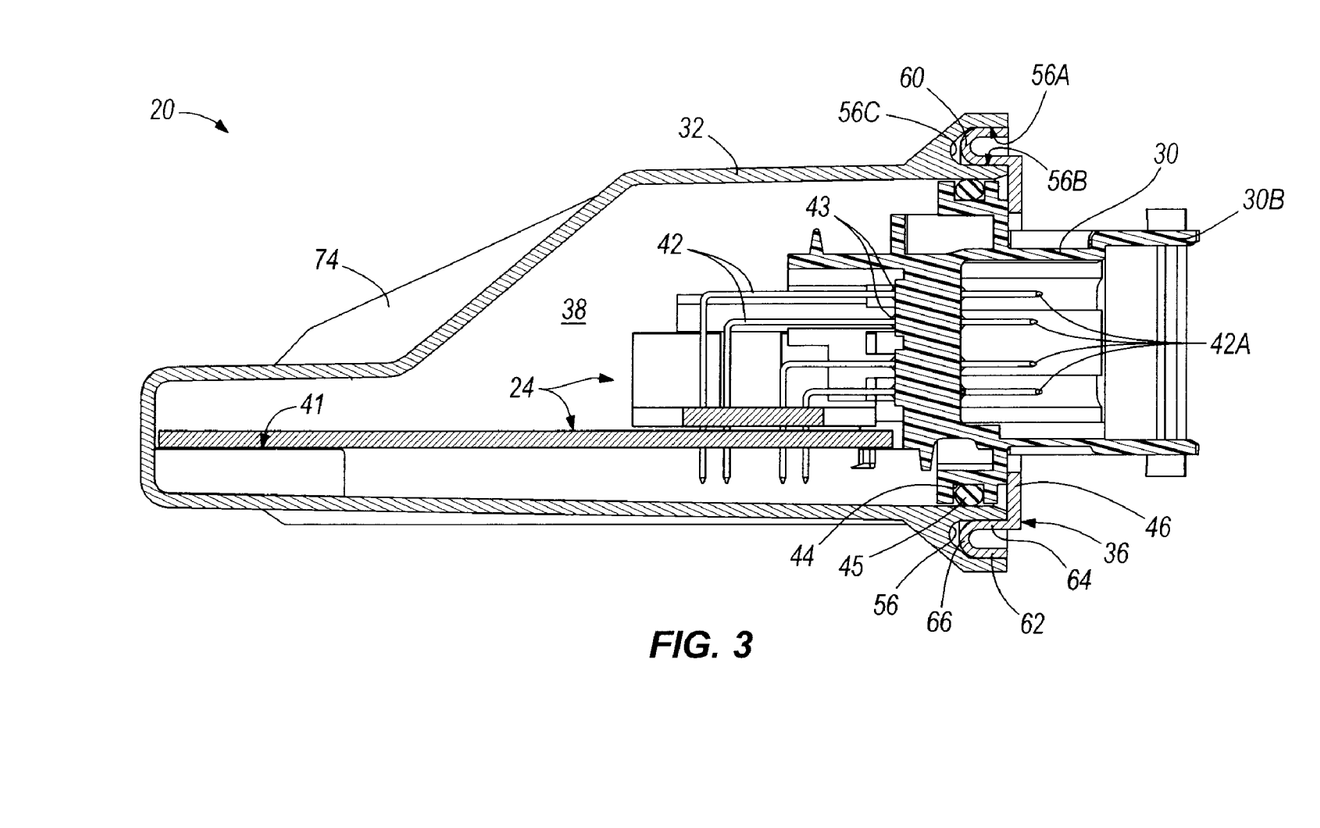
FIG. 3 is a cross-sectional view of the electronic control module of FIG. 1.
Figure 4:
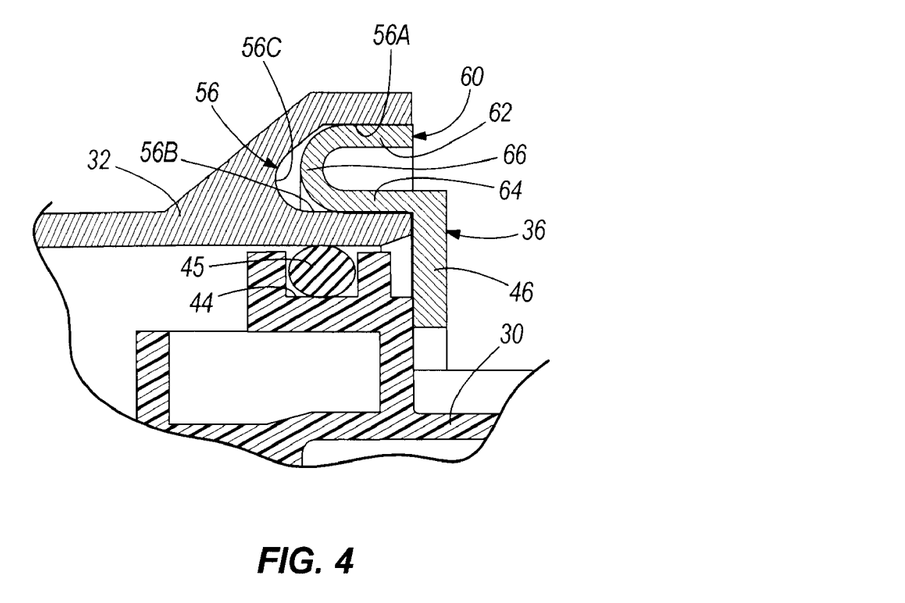
FIG. 4 is a detail cross-sectional view of a connection between portions of the electronic control module as shown in FIG. 3.

Connection portions 48 and 52 are provided on the body portion 32 and the cap portion 36, respectively, to enable the engagement of the body portion 32 with the cap portion 36 and to provide clamping pressure to the PCB 24, which may be stabilized without constraining its thermal expansion. As illustrated in FIGS. 2-4, the connection portions 48 and 52 are endless and extend along respective peripheries of the body portion 32 and the cap portion 36. In some constructions, the connection portions 48 and 52 have ends, and an additional sealing/coupling member may be incorporated to close a gap between the ends. In further constructions, such as an application where the PCB 24 need not be enclosed within the housing assembly 28 by a full peripheral connection, the connection portions 48 and 52 need not be endless and may instead form one or more separate connections having terminating ends.

The connection portion 48 on the body portion 32 includes a groove 56, while the connection portion 52 on the cap portion 36 includes a U-shaped projection, or flange 60. The groove 56 includes a first wall 56A, a second wall 56B, and a third wall 56C. In the illustrated construction, the first and second walls 56A and 56B are substantially parallel and spaced apart, and the third wall 56C is curved and extends between the first and second walls 56A and 56B. In other constructions, the groove 56 may have a different cross-sectional shape, such as first and second walls that are not parallel, a third wall that is not curved, etc.

As best shown in FIGS. 3 and 4, the flange 60 includes two engaging portions, specifically a first leg 62 and a second leg 64, and a hinge portion 66 connecting the first and second legs 62, 64 around the entire periphery. The first and second legs 62 and 64 are spaced a first distance apart, but resilient flexure at the hinge portion 66 allows the first and second legs 62 and 64 to be squeezed together, reducing the distance therebetween. Therefore, when the first and second legs 62 and 64 are compressed, the hinge portion 66 becomes stressed and exerts a reactive force biasing the legs 62 and 64 away from each other because the natural at-rest state of the flange 60 is with the first and second legs 62 and 64 spaced the first distance apart. The bias force provides increased friction between the flange 60 and the groove 56, which resists the separation of the cap portion 36 from the body portion 32. Thus, fasteners of any kind that are separate from the body portion 32 and the cap portion 36 are not necessary and need not be incorporated.

The flange 60 and groove 56 are self-fastening and self-sealing by simply inserting the flange 60 into the groove 56 around the mutual periphery. Even in a construction where the flange 60 and groove 56 are not endless, the connection(s) therebetween may be self-fastening and self-sealing. Sealing components or compounds separate from the body portion 32 and the cap portion 36 are not necessary and need not be incorporated. Effectively, two peripheral seals are formed: one between the first leg 62 and the first wall 56A of the groove 56 and another between the second leg 64 and the second wall 56B of the groove 56. Because the hinge portion 66 does not hilly fill the groove 56 in the depth dimension, a gap is formed between the first and second peripheral seals. Therefore, the peripheral seals are separated and in series with one another, and any dust, dirt, water, debris, etc. that might reach the cavity 38 must make its way through both peripheral seals.

In some constructions, such as an ECM 20 for use on a watercraft or other especially harsh applications, a sealant and/or adhesive material may be inserted between the flange 60 and the groove 56 and between the peripheral retaining portion 46 and the interface portion 30. Specifically, in one construction, peripheral beads of sealant/adhesive material are dispensed onto the third wall 56C of the groove 56 and onto the front of the interface portion 30. Therefore, additional seals and additional fixing strength are present between the body portion 32 and the cap portion 36 and also between the cap portion 36 and the interface portion 30. Such additional seals and fixing strength are included as a redundancy for the connection between the flange 60 and the groove 56, which provides ample sealing and mechanical coupling performance without separate sealing/adhesive material and without separate fasteners.

The elimination of fasteners and seals reduces component and assembly costs for the ECM 20 while providing comparable or better performance in terms of structure robustness (vibration, temperature, and impact), dissipation of heat from electronics, and resistance to fluid intrusion when compared against conventional constructions using die-cast, stamped, or plastic injection-molded housings with adhesives, sealants, thermal greases, and/or thermal interface pads separating the housing pieces. The elimination of either one of fasteners and intermediate seals provides some of the same advantages to a lesser degree.

Figure 5:
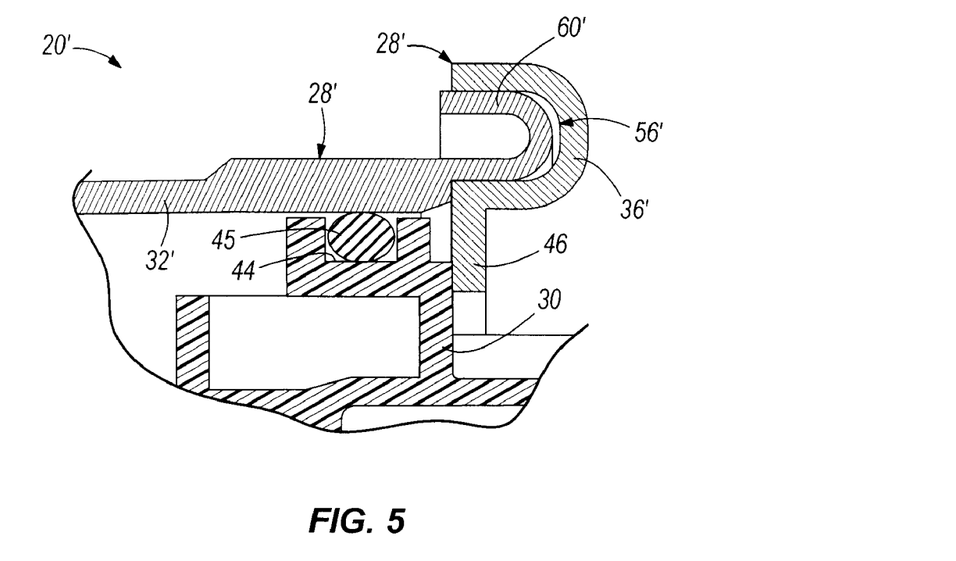
FIG. 5 is a cross-sectional view of an alternate electronic control module embodying the invention.

FIG. 5 illustrates an ECM 20' having a housing assembly 28' in which a body portion 32' is provided with a U-shaped flange 60', and a cap portion 36' is provided with a groove 56'. The ECM 20' is otherwise identical to the ECM 20 and thus, does not change the application or usefulness as compared with the ECM 20. Aside from being provided on opposite portions of the housing assembly 28' as compared to the housing assembly 28, the flange 60' and the groove 56' are dimensionally similar to the flange 60 and the groove 56, respectively. Therefore, the flange 60' and the groove 56' provide the same mutual engagement and functionality as described above with reference to the ECM 20, and further features of the ECM 20 described below are equally applicable to the ECM 20'.

Returning now to FIGS. 1-4, the housing assembly 28, including the body portion 32 and the cap portion 36, is formed by molding a metal alloy while in a thixotropic material state. The metal alloy can be a magnesium alloy, such as AZ91D. Such molding is referred to as thixomolding, resulting in thixomolded parts, both terms being tradenames of Thixomat, Inc. of Ann Arbor, Mich. Thixomolding equipment and processes are described in further detail in U.S. Pat. Nos. 4,964,455; 5,711,366; 5,819,839; 5,836,372; 5,878,804; 5,983,978; 5,996,679; 6,059,012; 6,736,188; and 7,028,746, all of which are hereby incorporated by reference. In an alternate construction, a metal heat sink is insert-molded or over-molded with thermal plastic resin or elastomer.

The body portion 32, which is not in direct contact with any heat-generating elements (e.g. elements that conduct electric current) of the PCB 24, is a good thermal conductor. The cavity 38 is formed to closely surround the PCB 24 to eliminate the need for venting and to limit the interior air volume and the resistance to heat transfer. Heat from the PCB 24 is absorbed by the body portion 32 through conduction, convection, and radiation, and transferred efficiently to the surrounding atmosphere by convection. Because of the nature of the groove 56 and flange 60 interface, even in a construction where a sealant/adhesive material is inserted between the third wall 56C and the hinge portion 66, the body portion 32 and the cap portion 36 remain in direct contact with each other. Therefore, heat transferred from the PCB 24 to the body portion 32 can be further conducted from the body portion 32 to the cap portion 36. Thus, the cap portion 36 provides additional thermal capacitance and, through convection with the surrounding atmosphere, additional heat sinking ability. Typically, intermediate seals and/or adhesives that completely disconnect housing components are especially limiting to heat transfer between the housing components. The engagement between the flange 60 and the groove 56 ensures that the body portion 32 and the cap portion 36 are not completely separated from each other by a seal and, or adhesive.

The body portion 32 is additionally formed with fins or ribs 74. The ribs 74 enhance the ability of the housing assembly 28 to transfer heat to the surrounding atmosphere by convection. The ribs 74 also provide stiffness to the body portion 32, which can prevent or flatten a warped PCB 24. Alternately, another intricate pattern may be formed in the body portion 32 and/or cap portion 36, such as a honeycomb pattern. The ribs 74 are easily formed in the thixomolding process, much like injection molding of plastic. The shape of the body portion 32 would be simple to form by injection molding of plastic, which can make complex shapes quite readily. However, forming the body portion 32 and the cap portion 36 from a metal alloy allows for better heat transfer and reduced electromagnetic emission as compared to plastic. The thixomolding process enables the housing assembly 28 to have the above-mentioned benefits of a metal alloy while being formed with the ribs 74 and other intricately-shaped features, which cannot be manufactured with similar precision with conventional metal forming operations. If the application for the ECM 20 permits, the housing assembly 28 may alternately be formed by die-casting aluminum, stamping aluminum or steel, metal injection-molding, hot die-casting, impact extrusion and injection-molding plastic, among other processes.

The cavity 38 may be coated with a dielectric material to electrically isolate the PCB 24 from the body portion 32. The thixomolding process, especially with magnesium alloy, results in a low surface porosity, which is suitable for coating. The dielectric coating on the body portion 32 may be black in color to increase the radiation aspect of the thermal transfer from the PCB 24. In some constructions, the cap portion 36 is electrically isolated from the PCB 24 by the body portion 32 and the interface portion 30 and need not be coated with the dielectric material. The cap portion 36 is also exposed to less heat from the PCB 24 as compared to the body portion 32. In some constructions, the dielectric coating improves the adhesion of a thixomolded component to a plastic resin when a thixomolded part is used as the insert in an insert-molded or over-molded plastic housing assembly and/or component. The dielectric coating on the body portion 32 may include but is not limited to one of epoxy, polyester, epoxy/polyester blend, e-coating, powder coating, paint, and ink.

Various features of the invention are set forth in the following claims.

What is claimed is:

1. An electronic control module comprising:
   a body portion;
   a printed circuit board positioned within the body portion; and
   a cap portion adapted to mate with the body portion;
   wherein one of the body portion and the cap portion is formed with a groove and the other of the body portion and the cap portion is formed with a projection that is resiliently deformed both upon entry into the groove and while positioned in the groove to both mechanically and sealingly couple the body portion and the cap portion;
   wherein the projection includes two substantially parallel engaging portions adapted for frictional engagement with the groove; and
   a joint portion allowing flexure of the two engaging portions relative to one another.

2. The electronic control module of claim 1, wherein the body portion is formed with the groove.

3. The electronic control module of claim 1, wherein the body portion is formed of thixomolded magnesium metal alloy.

4. The electronic control module of claim 3, wherein the cap portion is formed of thixomolded magnesium metal alloy.

5. The electronic control module of claim 3, wherein an inner surface of the body portion has a black dielectric coating.

6. The electronic control module of claim 5, wherein the black dielectric coating is one of epoxy, polyester, epoxy/polyester blend, e-coating, powder coating, paint, and ink.

7. The electronic control module of claim 1, wherein the groove and the projection are both endless.

8. The electronic control module of claim 1, wherein the groove and the projection are directly engaged without a separate sealing component therebetween.

9. The electronic control module of claim 1, wherein the cap portion mates with the body portion via the groove and projection and without any additional fasteners.

10. The electronic control module of claim 1, wherein at least one of the body portion and the cap portion is formed from thixomolded metal alloy.

11. The electronic control module of claim 1, wherein the engaging portions are resiliently biased a distance apart by the joint portion, and contact between the engaging portions and the groove reduces the distance between the engaging portions.

12. The electronic control module of claim 1, wherein the body portion includes a first wall, the first wall being formed with a plurality of heat-dissipating fins extending therefrom.

13. An electronic control module comprising:
a body portion;
a printed circuit board positioned within the body portion; and
a cap portion adapted to mate with the body portion;
wherein one of the body portion and the cap portion is formed with a groove and the other of the body portion and the cap portion is formed with a projection that is resiliently deformed both upon entry into the groove and while positioned in the groove to mechanically and sealingly couple the body portion and the cap portion, the projection including
two substantially parallel engaging portions spaced a distance apart and adapted for frictional engagement with the groove, and
a joint portion connecting the two engaging portions and allowing flexure of the two engaging portions relative to one another to reduce the distance between the engaging portions and exert a reactive force upon the groove when the projection is positioned within the groove, wherein the joint portion is first to enter the groove when the cap portion is mated with the body portion.

14. The electronic control module of claim 13, wherein the groove and the projection are both endless.

15. The electronic control module of claim 13, wherein the groove and the projection are directly engaged without a separate sealing component therebetween.

16. The electronic control module of claim 13, wherein the cap portion mates with the body portion via the groove and projection and without any additional fasteners.

17. The electronic control module of claim 13, wherein at least one of the body portion and the cap portion is formed from thixomolded metal alloy.

* * * * *